United States Patent
Fisch et al.

(10) Patent No.: US 6,276,370 B1
(45) Date of Patent: Aug. 21, 2001

(54) SONIC CLEANING WITH AN INTERFERENCE SIGNAL

(75) Inventors: Emily E. Fisch, Burlington, VT (US); Glenn W. Gale, Austin, TX (US); Harald F. Okorn-Schmidt, Putnam Valley, NY (US); William A. Syverson, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,827

(22) Filed: Jun. 30, 1999

(51) Int. Cl.[7] .................. B08B 3/02; B08B 3/12
(52) U.S. Cl. .............. 134/1.3; 134/153; 134/184; 134/198; 134/902
(58) Field of Search .............. 134/1.3, 153, 184, 134/186, 198, 902

(56) References Cited

U.S. PATENT DOCUMENTS

| | | |
|---|---|---|
| 4,071,225 | 1/1978 | Holl . |
| 4,326,553 | 4/1982 | Hall . |
| 4,391,672 | 7/1983 | Lehtinen . |
| 4,401,131 | 8/1983 | Lawson . |
| 4,705,054 | 11/1987 | Fields . |
| 4,736,759 | 4/1988 | Coberly et al. . |
| 4,736,760 | 4/1988 | Coberly et al. . |
| 4,788,992 | 12/1988 | Swainbank et al. . |
| 4,854,337 | 8/1989 | Bunkenburg et al. . |
| 4,979,994 | 12/1990 | Dussault et al. . |
| 5,013,366 | 5/1991 | Jackson et al. . |
| 5,038,808 | 8/1991 | Hammond et al. . |
| 5,383,484 | 1/1995 | Thomas et al. . |
| 5,427,622 | 6/1995 | Stanasolovich et al. . |
| 5,533,540 | 7/1996 | Stanasolovich et al. . |
| 5,579,792 | 12/1996 | Stanasolovich et al. . |
| 5,834,871 | 11/1998 | Puskas . |
| 6,016,821 | * 1/2000 | Puskas ........................ 134/186 |
| 6,019,852 | * 1/2000 | Pedziwiatr et al. .......... 134/184 X |

* cited by examiner

Primary Examiner—Philip R. Coe
(74) Attorney, Agent, or Firm—James M. Leas

(57) ABSTRACT

An array of ultrasonic or megasonic transducers is used to clean a substrate. An interference signal that is the superposition of the signals from each transducer enhances the cleaning. The system improves cleaning by providing a higher intensity beam than is available from uncoupled transducers to facilitate removal of smaller particles. In addition, the beam can be swept across the substrate to provide a uniform cleaning of the entire surface, avoiding dead spots. The system can be adapted for use in a vessel or for single wafer processing with a stream of fluid or a puddle of fluid.

48 Claims, 10 Drawing Sheets

SONIC CLEANING WITH AN INTERFERENCE SIGNAL

FIELD OF THE INVENTION

This invention generally relates to sonic cleaning, such as ultrasonic or megasonic cleaning. More particularly, it relates to cleaning very small particles from semiconductor wafers.

BACKGROUND OF THE INVENTION

Ultrasonic and megasonic energy cleaners have been in use for removing particles from immersed substrates, such as semiconductor wafers. Higher frequency megasonic cleaners were implemented as it was recognized that energy for the cleaning is limited by cavitation—the generation of bubbles in low pressure regions—and by the width of a laminar flow boundary layer. The collapse of these bubbles on the wafer surface caused damage to films on the wafer. The higher frequencies permitted the use of much higher energy before cavitation was initiated. The higher frequencies also resulted in a thinner fluid boundary layer. Both these effects permitted removal of smaller particles that more strongly adhered to the wafer surface.

However, as semiconductor wafer line widths get smaller, so does the size of particle that must be removed by wafer cleans. Typically a killer defect is created by a particle having a size that is greater than half the device line width, so emerging technologies having 0.2 $\mu$m lines require that particles that are equal or greater than 0.1 $\mu$m in size be removed.

Various improvements have been proposed to improve sonic cleaners, such as providing antireflection mechanisms to avoid standing waves, as described in commonly assigned U.S. Pat. No. 5,427,622. Another technique to sweep the frequency of vibration to eliminate or reduce standing waves, resonances, cavitation and non-uniform sound fields is described in U.S. Pat. No. 5,834,871. A staggered array of megasonic transducers, each emitting a focused beam of megasonic energy, and arranged so that the emitted beams from all the transducers collectively envelop the objects to be cleaned is described in U.S. Pat. No. 5,383,484. However, these ideas have not sufficiently provided the ability to remove the 0.1 micrometer and smaller particles from the surface of wafers. Thus, a better solution for megasonic cleaning is required to address the challenges of breaking fluid boundary layers and removing the smaller particles without damaging the fine lines and other films on a wafer, and solutions are provided by the following invention.

SUMMARY OF THE INVENTION

It is therefore an object of the present invention to remove small particles from a substrate, such as a semiconductor wafer.

It is a further object of the present invention that the apparatus provides an interference signal for cleaning the wafer.

It is a further object of the present invention that the interference signal is the superposition of signals from a plurality of transducers directed at the same surface of the wafer.

It is a feature of one embodiment of the present invention to sweep the interference signal across the wafer.

It is another feature of the present invention that the interference signal provides an amplitude greater than the amplitude of either of its component signals.

It is an advantage of the present invention that sonic energy is applied uniformly across the wafer while interference minima (dead spots) are avoided.

These and other objects, features, and advantages of the invention are accomplished by an apparatus for cleaning a substrate having a first side, comprising a fluid. A first transducer and a second transducer are coupled to the fluid. The first transducer directs a first signal having a first frequency and a first phase to the first side of the substrate. The second transducer directs a second signal having a second frequency and a second phase to the first side of the substrate so as to provide an interference signal to the first side that is the superposition of the first signal and the second signal. Neither the first signal nor the second signal passes through the substrate before interfering. The interference signal is for cleaning the substrate.

In one embodiment, the interference signal is swept across the substrate, thereby providing more uniform cleaning than can be achieved with a static signal. The sweeping is accomplished electronically by altering the phase difference between the two signals. The sweeping can also be accomplished mechanically.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The sonic cleaner of the present invention, such as an ultrasonic or megasonic cleaner, uses the interference signal from two or more transducers for cleaning a substrate, such as a semiconductor wafer. In the past, interference has been avoided in semiconductor wafer cleaning because interference from two transducers or from reflections within a vessel have produced areas that had less intensity or no intensity, that is, dead spots. The present inventors have found a way to take advantage of interference to substantially improve ultrasonic or megasonic cleaning by providing a higher intensity beam or by sweeping the beam across the wafers.

Figure 1C:
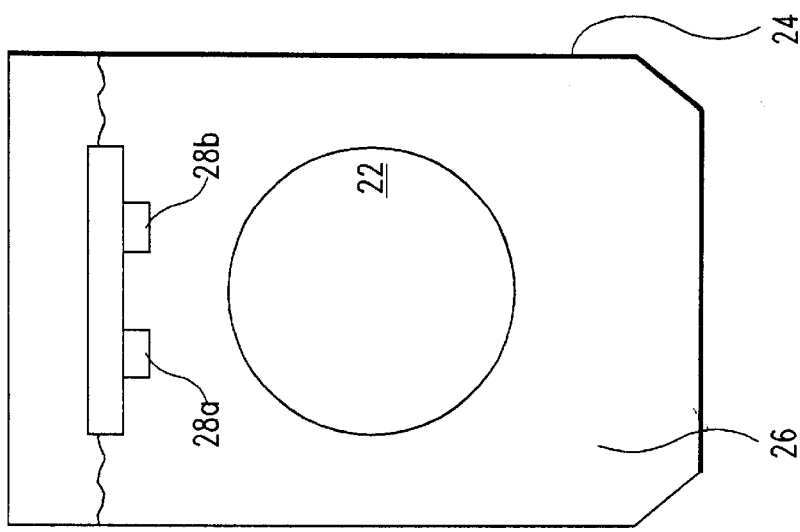
FIGS. 1a–1c are cross sectional views showing a vessel having a boat of wafers submerged in a fluid while an interference signal from a pair of transducers coupled to the fluid is used to clean the wafers.
Figure 1B:
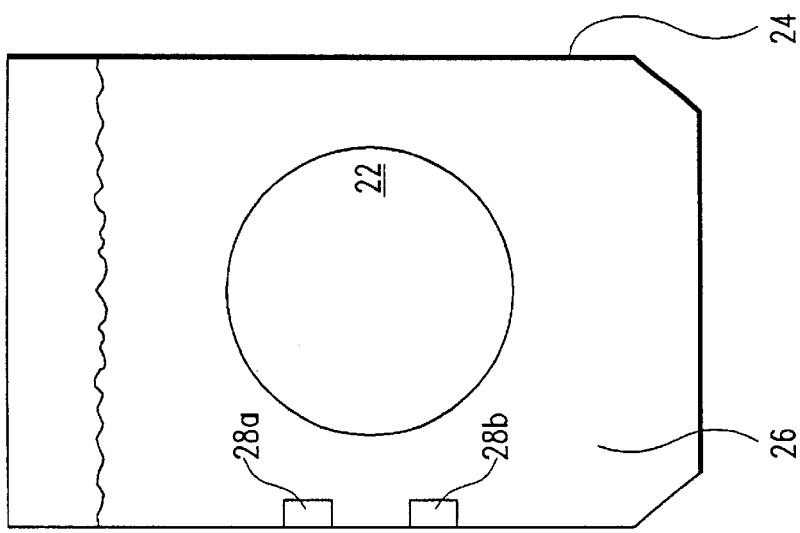
Figure 1A:
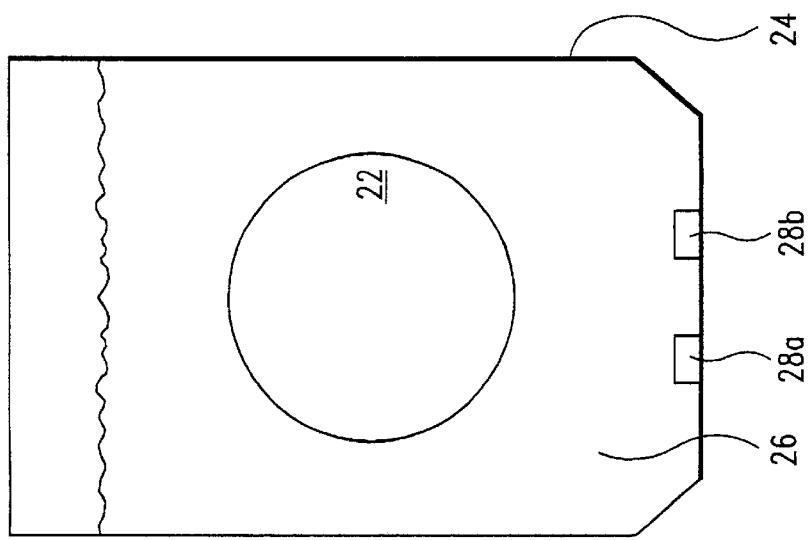

In one embodiment, semiconductor wafers 22 that can be supported in a boat (not shown) are provided in vessel 24 filled with fluid 26, as shown in FIG. 1a. Vessel 24 is equipped with a pair of linear ultrasonic or megasonic transducers 28a, 28b that provide sonic signals to wafers 22 through fluid 24. Signal from sonic transducer 28a has frequency $f_1$, and phase $\phi_1$. Signal from transducer 28b has frequency $f_2$ and phase $\phi_2$. Typically frequencies are in the range from 20 kHz to about 5 MHz. Signals from transducers 28a and 28b interfere before striking surfaces of wafers 22, providing an interference signal that is the superposition of signals from transducers 28a and 28b. Wafers 22 are cleaned by this interference signal. While two transducers are shown, a larger array of transducers may be used. The array of transducers can be organized in a one, two, or three-dimensional pattern. Also, the transducers can be located along a side wall or can be lid mounted, as shown in FIGS. 1b–1c.

Figure 2A:
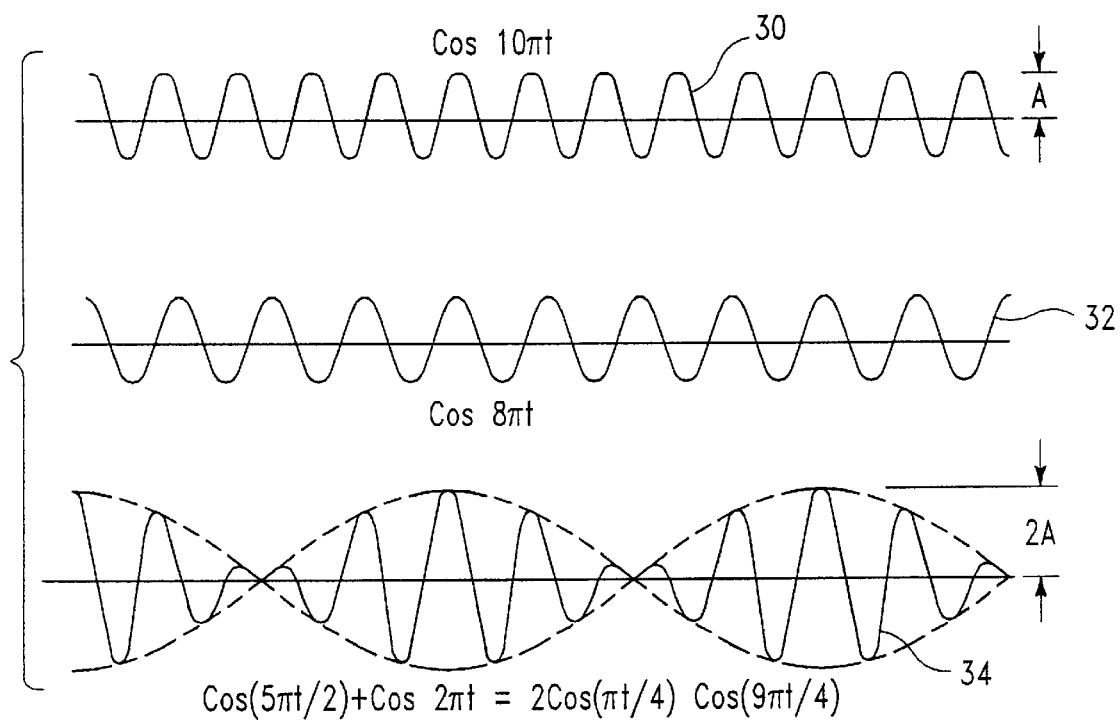
FIG. 2a is a wave diagram showing two waves having the same amplitude and different frequencies and the interference pattern resulting from their superposition.
Figure 2B:
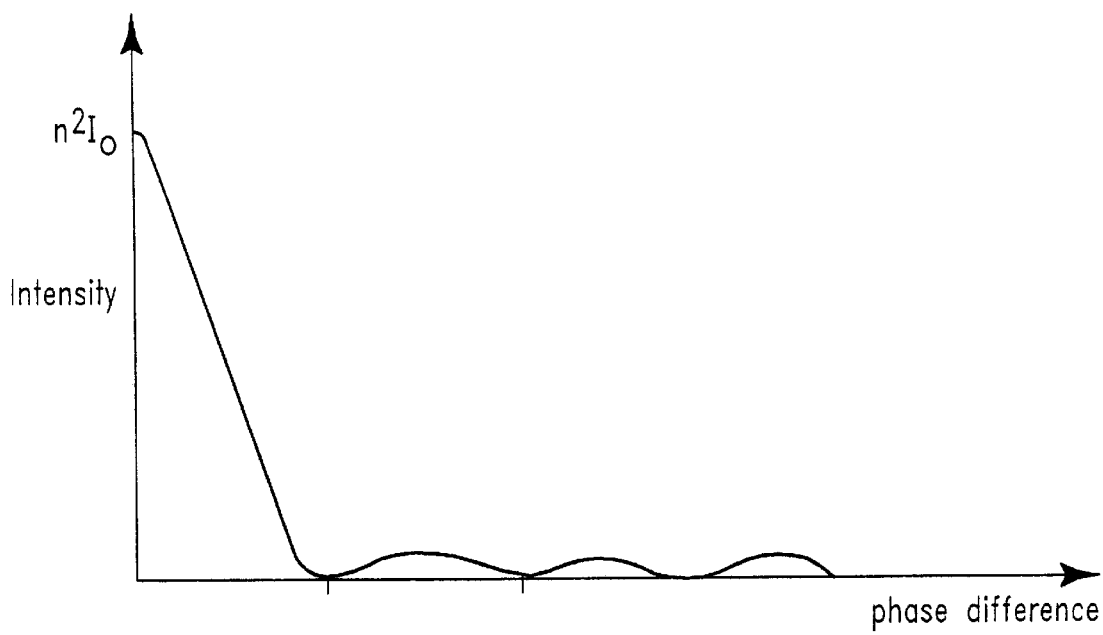
FIG. 2b is a graph of intensity v. phase showing that the intensity resulting from the superposition of waves from an array of n transducers having the same frequency and amplitude $1_0$ is proportional to $n^2 I_0$.

For example, transducer 28a may be set to provide signal 30 having amplitude A and frequency $\omega_1$, as shown in FIG. 2, while transducer 28b is set to provide signal 32, having amplitude A and a different frequency $\omega_2$. A single type of transducer can be used to generate both signals while the transducers are operated with different frequencies within their bandwidth as described in U.S. Pat. No. 5,834,871. Interference signal 34 is a linear superposition of signal 30 and signal 32. Interference signal 34 has two characteristic frequencies; it pulses or beats with a frequency equal to the difference between the two transducer frequencies and within each beat it oscillates with a frequency equal to the sum of the two transducer frequencies. Interference signal 34 has an amplitude that varies from zero to the sum of the two transducer amplitudes, 2A. Since the maximum intensity of a signal is proportional to the square of the amplitude, the maximum intensity of interference signal 34 is $4A^2$, four times the intensity $A^2$ of either signal 30 or signal 32. Thus, significantly greater peak intensity pulses are achievable by providing a pair of transducers to provide interference signal 34 as compared with the intensity that can be delivered by signals from a single transducer or from a pair of transducers whose signals reach different portions of the wafer and avoid substantial interference. For an array of n transducers each having a maximum intensity $I_0$, the peak intensity of the array is equal to $n^2 I_0$, as shown in FIG. 2b. Thus, substantially higher intensity is available in an interference beam provided from an array of two or more transducers. In addition, the interference signal provides a higher frequency than is provided by either transducer alone and it also provides a beat frequency. Of course, if the transducers have the same frequency and are in phase then the interference signal will have the larger amplitude and intensity but without the higher frequency or beats.

Figure 3:
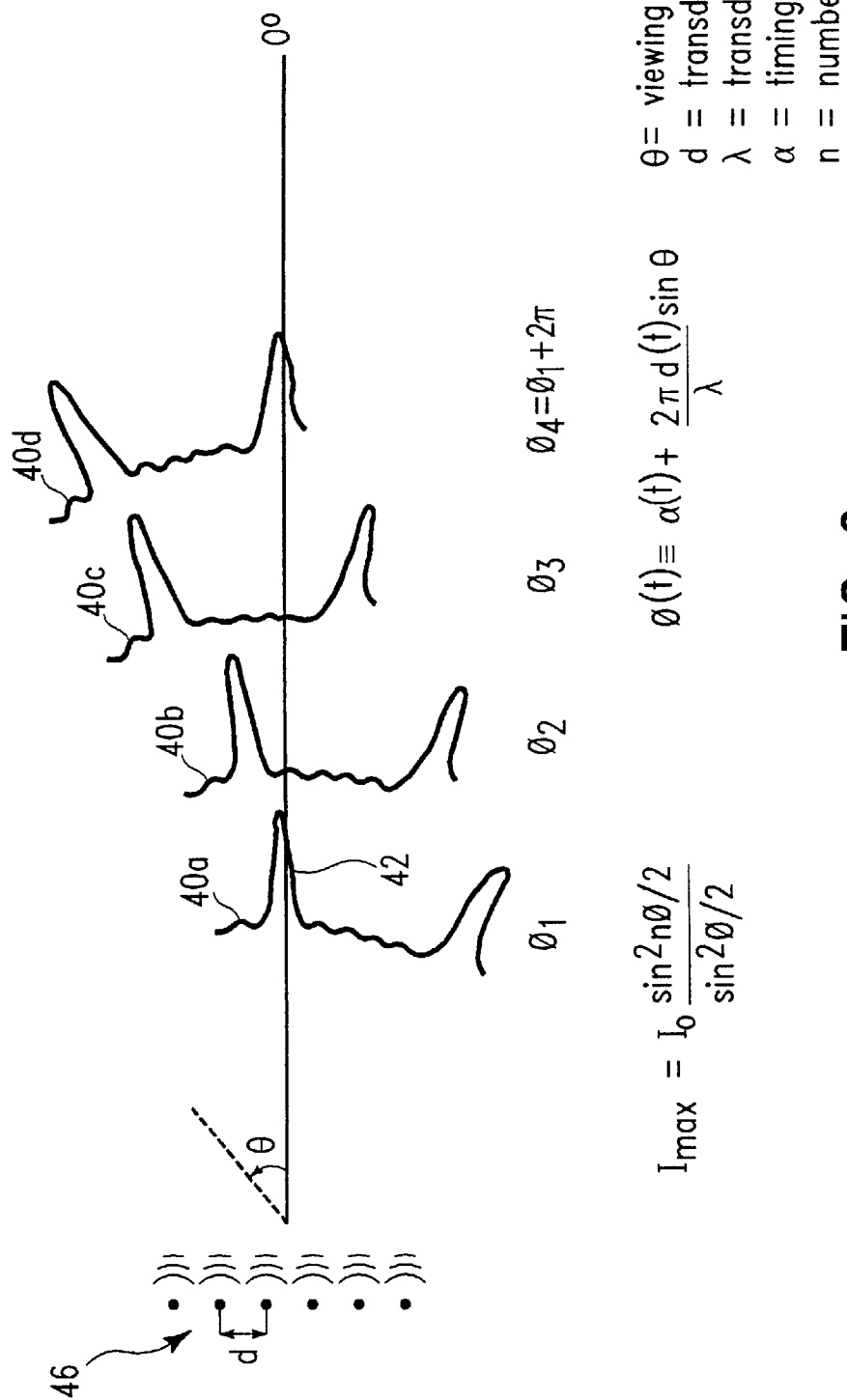
FIG. 3 is a diagram showing how an interference pattern is swept across a wafer by changing the phase of each of the transducers of an array of transducers.

In addition, the relative phase of transducers 28a and 28b can be varied to sweep a high intensity beam across wafers 22, as shown in FIG. 3. Sequential curves 40a–40d show how the viewing angle θ of intensity maximum 42 of a signal from array of transducers 46 varies with time as phase $\phi(t)$ of each of the transducers in the array of transducers is changed. Because array 46 has six transducers, intensity maximum 42 has an intensity that is 36 times the intensity of any one transducer of array 46. Array 46 can have transducers arranged in a line, in a plane, or conforming to the shape of the substrate being cleaned. Phase $\phi(t)$ of each of the transducers in the array of transducers is changed to steer the beam across the wafer either by varying timing a or by varying physical separation between adjacent transducers d with time according to the relation:

$$\phi(t)=\alpha(t)+(2\pi d(t)/\lambda)\sin\theta$$

Figure 4:
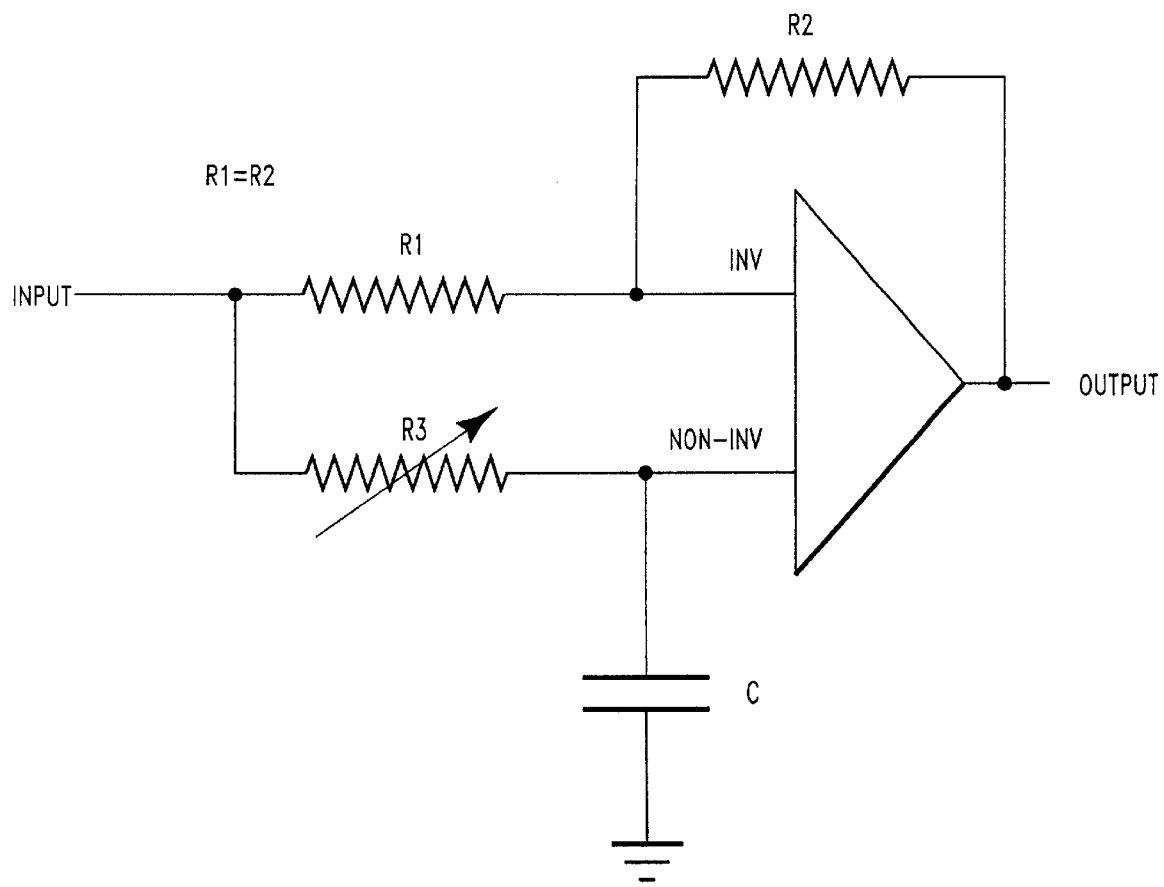
FIG. 4 is a circuit diagram illustrating one embodiment of electronic control of phase of a transducer.

Sweeping intensity maximum 42 across the wafers ensures that all portions of each wafer receives approximately uniform treatment by providing an equal energy dose to all portions of each wafer. Sweeping also eliminates concerns about dead spots due to anti-nodes. Preferably phase control of each transducer is accomplished electronically using a phase shift circuit. A block diagram of a well known operational amplifier phase shifter circuit is provided in FIG. 4. By varying R3, phase can be varied at a given frequency from nearly 0 to nearly 180 degrees. For operation around 1 MHz, a high frequency operational amplifier, such as the Burr-Brown OPA620 is recommended. Particles are effectively removed by sweeping the beam across the wafer. The beam provided from an array of transducers is more directional and therefore intensity varies less with distance. As a result the beam provides more uniform cleaning of the wafer in addition to the advantages described herein above.

Figure 5:
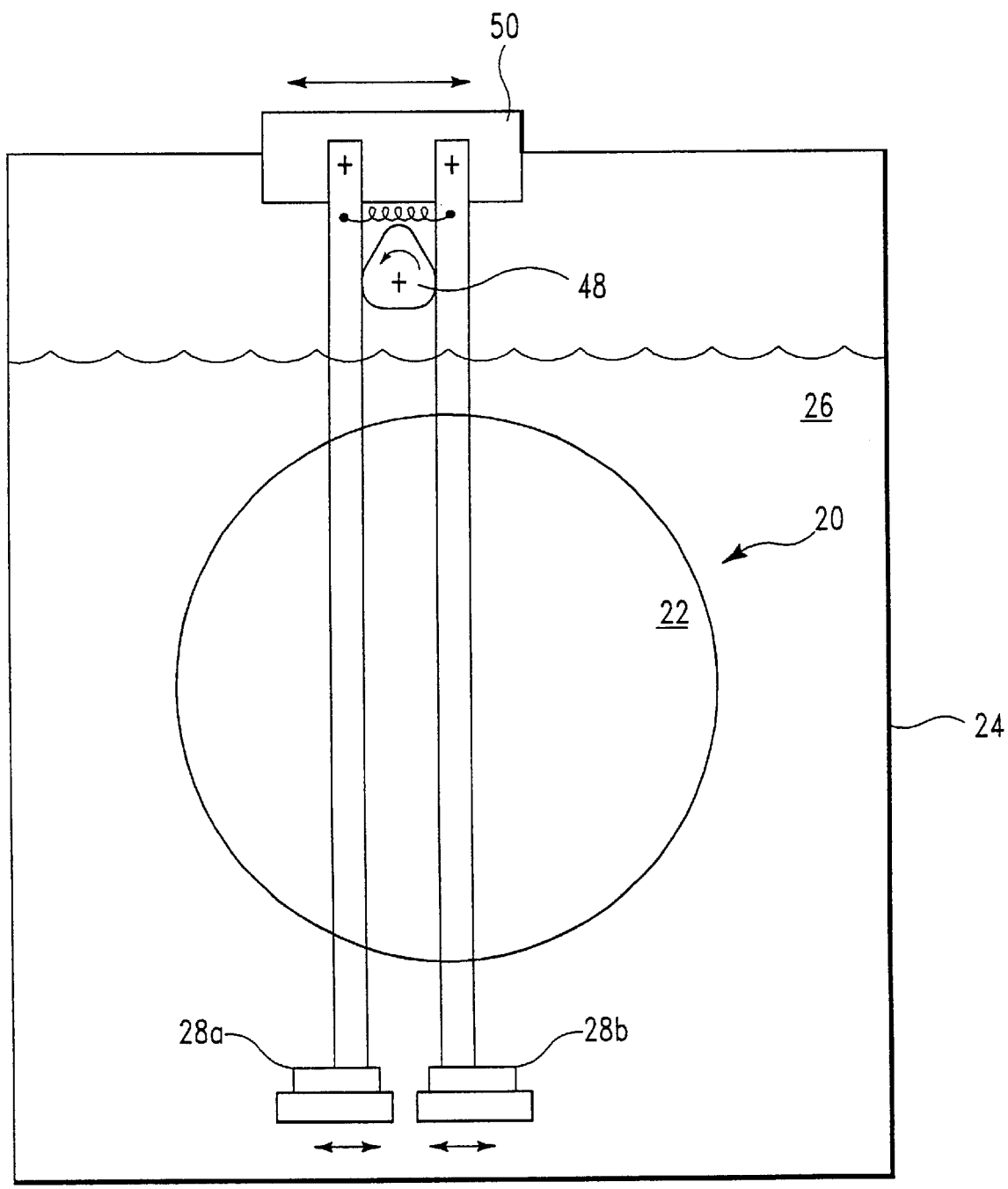
FIG. 5 is a cross sectional view showing a vessel having a boat of wafers submerged in a fluid while an interference signal from a pair of transducers coupled to the fluid is used to clean the wafers and shows how phase can be changed mechanically by moving the transducers back and forth with an eccentric cam or by moving the entire array of transducers with respect to the wafers.

Phase can also be changed mechanically by moving at least one transducer of an array of interfering transducers using apparatus similar to that provided in U.S. Pat. Nos. 4,854,337 and 5,038,808, incorporated herein by reference. U.S. Pat. No. 4,705,054, incorporated herein by reference, shows another transducer drive mechanism. The '337, '808, or '054 patents show how a single transducer can be moved under a cassette of wafers to ensure that all points on the wafers get the same cleaning. While these patents do not involve interference between signals from different transducers, it is clear that the apparatus can be used to move one transducer relative to another transducer. For example, a single transducer can be held fixed while a second transducer moves, or two transducers can move in opposite directions, or the two transducers can move in the same direction at different speeds using the apparatus of the referenced patents. A scheme in which the positions of both transducers 28a, 28b change under the control of asymmetric cam 48 is shown in FIG. 5. In another embodiment, also shown in FIG. 5, drive mechanism 50 provides that transducers 28a, 28b move horizontally under wafers 22 to sweep signal across the wafers. In this case phase can be held constant and the interference signal is swept by providing relative movement between the array of transducers and the wafers.

One way is by moving the array of transducers under the wafers, for example, using a drive mechanism of the '337, '808, or '054 patents. Alternatively, the wafers can move, as described in U.S. Pat. No. 4,736,759, incorporated herein by reference. In addition, the transducers can be located above the wafers or along a side wall of the tank while providing relative movement between transducers of the array or providing relative movement between the array of transducers and the wafers.

Figure 6A:
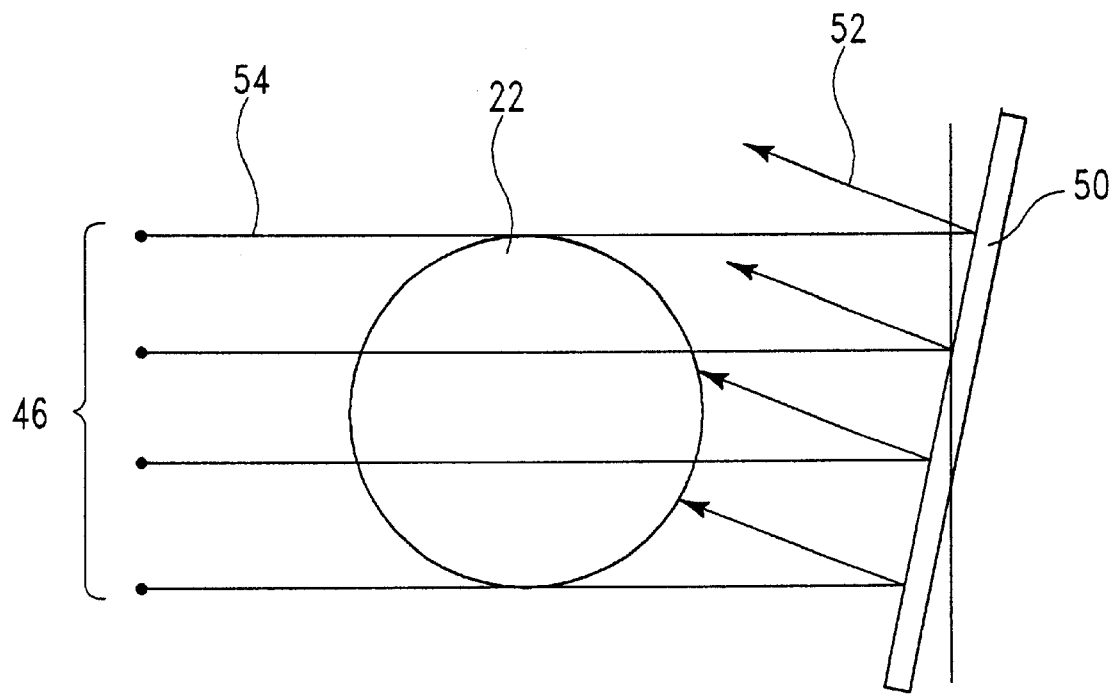
FIG. 6a is a cross sectional view showing an angled and pivoting reflecting wall reflecting the interference signal back over the wafer at an angle to the incident signal.
Figure 6B:
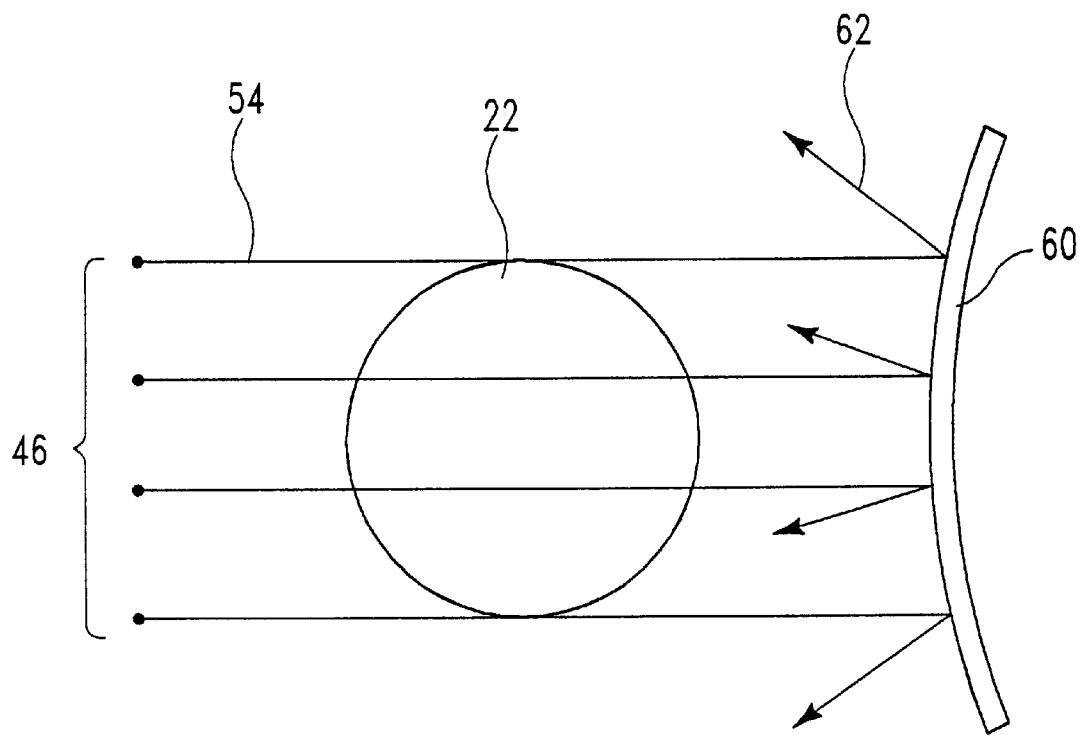
FIG. 6b is a cross sectional view showing a convex reflecting wall reflecting the interference signal back over the wafer at many angles relative to the incident signal.

A reflecting wall can be used to reflect the interference signal back over the wafer. As shown in FIGS. 6a–6b the reflection can be accomplished so as to avoid or minimize interference between incident and reflecting waves that result in regions of low intensity, or dead spots. Angled reflecting wall 50 of FIG. 6a avoids substantial interference by directing reflecting waves 52 across wafers 22 at an angle to incident waves 54 from array of transducers 46. Angled reflecting wall 50 can be pivoting to sweep reflected waves 52 across wafers 22 or it can be held at a fixed angle. In another embodiment, convex reflecting wall 60, shown in FIG. 6b, directs reflecting waves 62 at a wide range of angles, attenuating any portion of reflected waves 62 that interfere with incident waves 54 from transducer array 46. Either scheme eliminates regions of low power intensity on wafers 22.

A vessel having damping walls can be used to avoid reflection and interference of reflected waves with waves coming directly from a transducer. Damping provides an alternate way to avoid destructive interference and regions of reduced intensity. A damping surface is provided in vessel 24 with damping provided by anecohic structures as shown in FIG. 3 of U.S. Pat. No. 5,533,540 (the '540 patent), incorporated herein by reference, or gas bubbles, as shown in FIG. 2 of the '540 patent. Gas bubbles can be provided from an external gas supply or by catalytic fluid decomposition.

Figure 7A:
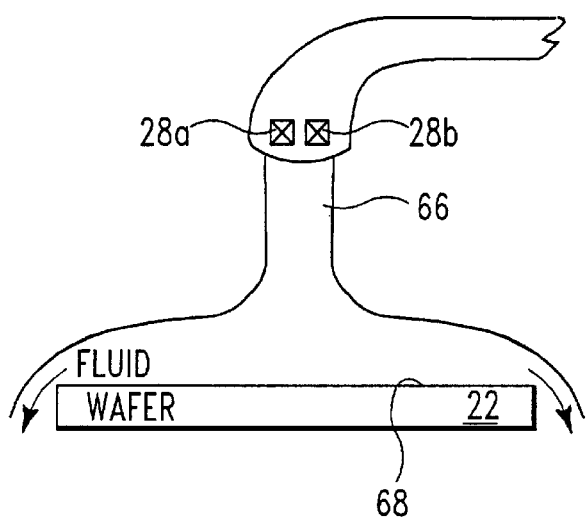
FIG. 7a is a cross sectional view showing two transducers coupled to a fluid stream directed perpendicular to a wafer surface to provide an interference signal at the wafer surface.
Figure 7B:
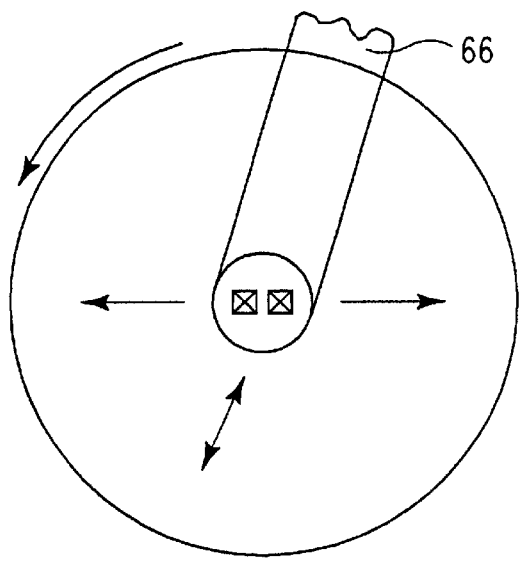
FIG. 7b is a top view of the apparatus of FIG. 7a, showing two transducers coupled to a fluid stream to provide an interference signal at a wafer surface wherein the stream is scanning across the wafer surface while the wafer rotates.
Figure 7C:
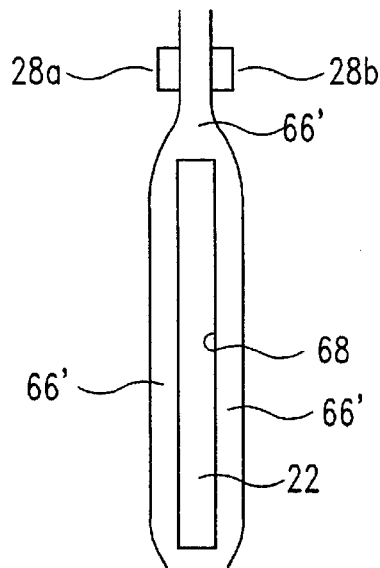
FIG. 7c is a cross sectional view showing two transducers coupled to a fluid stream directed along a wafer surface to provide an interference signal at the wafer surface.

In another embodiment fluid stream 66 is directed on substrate 22 as shown in FIGS. 7a–7c. Two or more sonic transducers 28a, 28b are coupled to fluid stream 66 providing an interference signal at wafer surface 68. Fluid stream 66 can be directed perpendicular to wafer surface 68 (FIG. 7a). Fluid stream 66 is scanned across wafer surface 68 to cover all areas, and wafer 22 can rotate during the scanning, as shown in FIG. 7b. Of course, scan speed or interference beam intensity can be varied during the scan to provide more uniform cleaning, as described in commonly assigned U.S. patent application Ser. No. 08/893,945 to Buker, et al. In addition to adjusting the power to the transducers, intensity can also be changed as radial position changes by adjusting frequency or phase of transducers 28a', 28b' of the transducer array. Frequency can also be adjusted to provide beats and high frequency signal, as described herein above. In another embodiment, fluid stream 66' can be directed along wafer surface 68 or along both wafer surfaces, as shown in FIG. 7c while coupling interference signal from transducers 28a, 28b to fluid stream 66'.

Figure 8A:
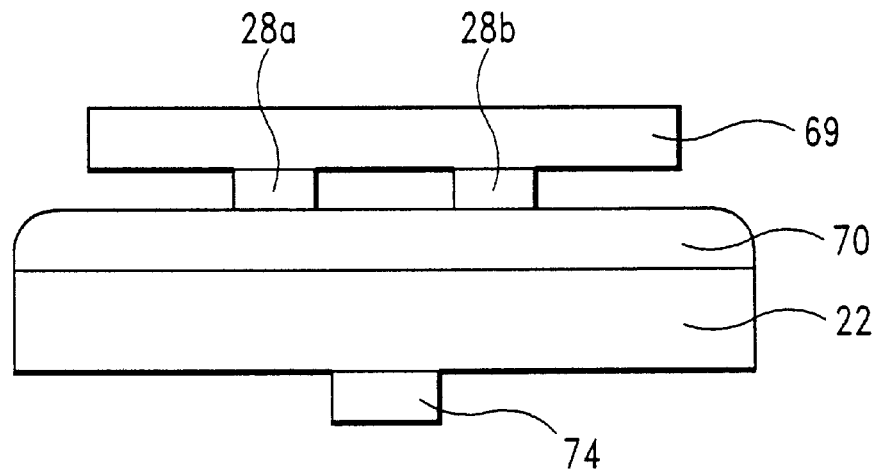
FIG. 8a is a cross sectional view showing an array of transducers coupled to a fluid puddled on a wafer surface to provide an interference signal at the wafer surface.
Figure 8B:
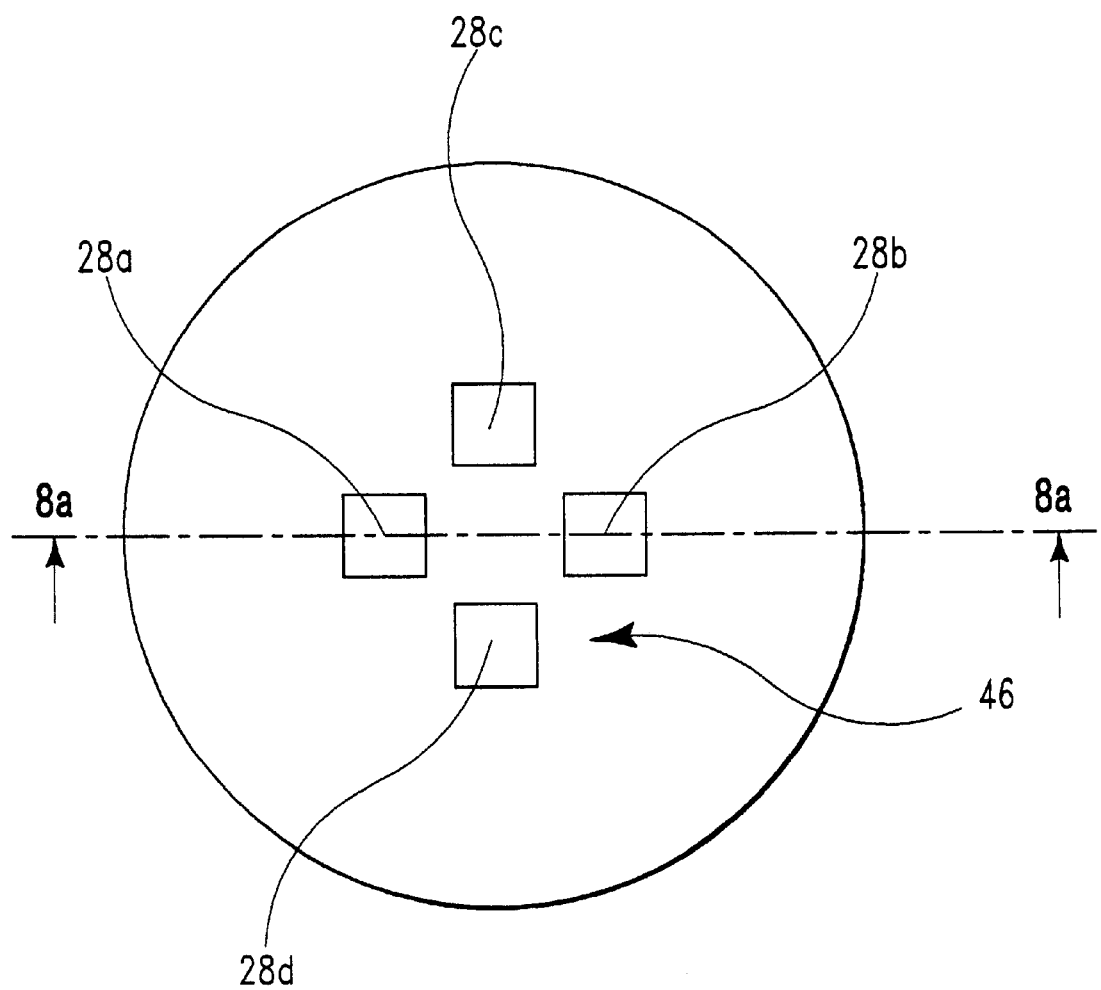
FIG. 8b is a top view of the apparatus of FIG. 8a, showing four transducers coupled to a fluid puddled on a wafer surface to provide an interference signal at the wafer surface wherein the wafer rotates to provide angular uniformity.
Figure 9:
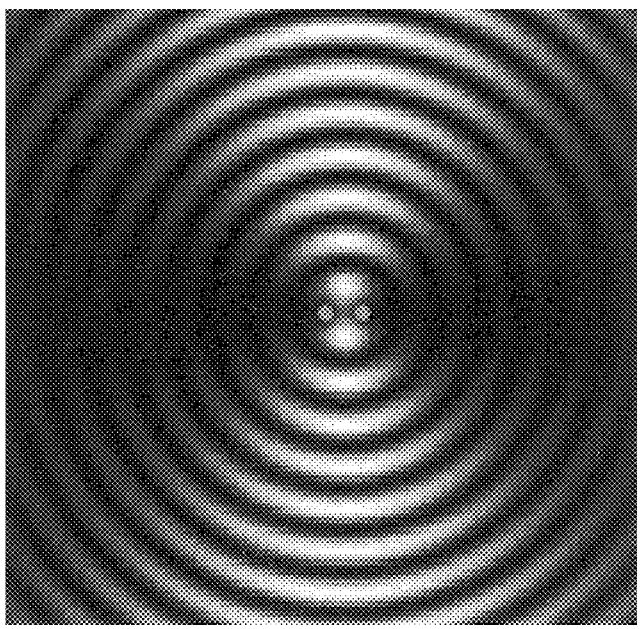
FIG. 9 is a top view of a computer generated interference pattern in which two transducers are coupled to a fluid puddled on a wafer surface.

Alternatively transducers 28a, 28b (or array of transistors 46) are coupled to puddle 70 providing an interference signal at wafer surface 68, as shown in FIGS. 8a–8b. Transducer array 46 is mounted on mounting plate 69. Transducers 28a, 28b can be spaced and provided with frequency and phase to provide a more directional interference signal, as shown in the computer generated model of FIG. 9, to improve radial uniformity of cleaning. In the model the two transducers are separated by one unit of distance and the frequency is set to provide a wavelength of one unit. In operation wafer 22 (not visible in FIG. 9) is slowly rotated on chuck 74 to eliminate angular nonuniformity. Alternatively an array of transducers is used, such as the four transducers illustrated in FIG. 8b. Sequentially firing opposing pairs effectively rotates the signal to uniformly clean the surface of wafer 22; transducers 28a and 28b fire simultaneously and then transducers 28c and 28d fire. The intensity is restricted to avoid damage in the center, where the interference signal is most intense, while providing enough intensity to adequately clean at the periphery of wafer 22. Because the interference signal is more directional than would be a signal from a single transducer, there is less radial variation in intensity, so the system permits cleaning all portions of the wafer without damage in the center. The system also allows for providing different frequencies from each transducer to provide an interference signal with characteristic sum and difference frequencies, as described herein above. The higher frequency signal is more effective at cleaning smaller particles. Also, a slowly oscillating function can sweep the signal.

No vessel is needed in the embodiments of FIGS. 7a–10c. Thus, problems caused by reflection from vessel walls are avoided. A further advantage to the single wafer puddle concept is that fluid use is very small. The single wafer scheme also provides for spinning off fluid 70. New fluid is then applied and the puddle ultrasonic cleaning and spinning steps are repeated to facilitate a high level of cleaning.

Figure 10C:
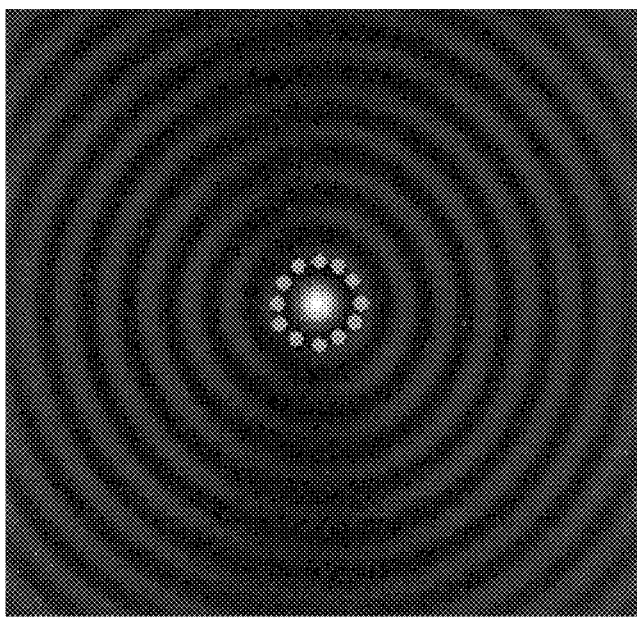
FIG. 10c is a top view of a computer generated interference pattern of the transducers of FIGS. 10a and 10b.
Figure 10A:
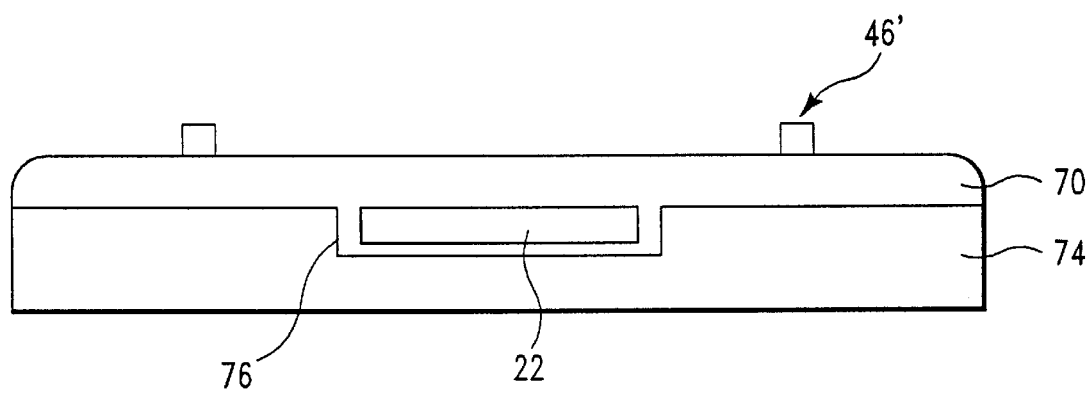
FIG. 10a is a cross sectional view showing a circular array of transducers located beyond the periphery of a wafer and coupled to a fluid puddled on the wafer surface to provide an interference signal at the wafer surface within the array.
Figure 10B:
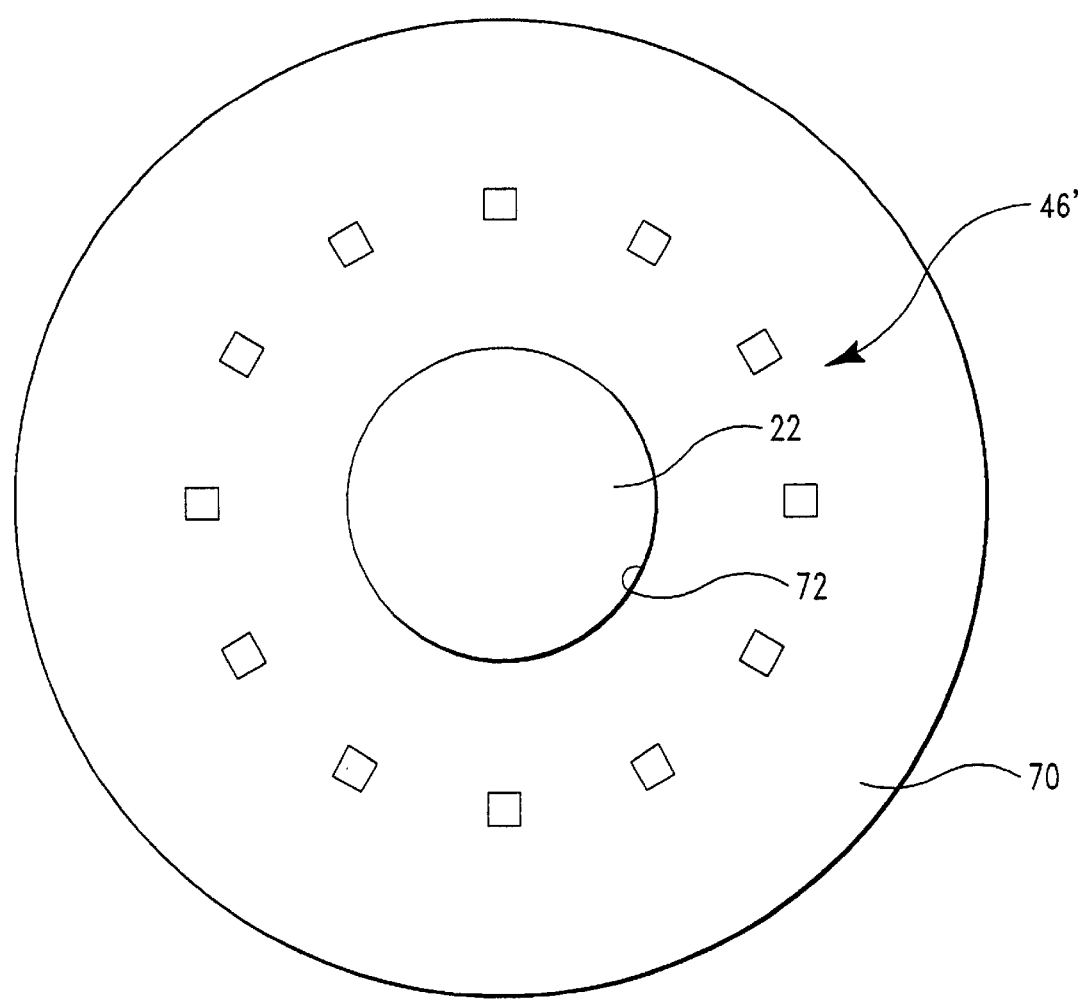
FIG. 10b is a top view of the apparatus of FIG. 10a, showing the array of transducers.

Another configuration has circular array of transducers 46' located beyond peripheral edge 72 of wafer 22, as shown in FIGS. 10a–10c. Transducers are coupled to fluid 70 puddled on wafer 22 and extending over chuck 74 which has recess 76 for wafer 22. The computer model in FIG. 10c shows uniform cleaning across a region within circular array 46' where wafer 22 is located. Although FIG. 10a–10c show a single wafer cleaning apparatus, this configuration can also be provided in a tank, as shown in FIG. 1a, except elongated transducers would be arranged in an array around peripheral edges of wafers 22.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. An apparatus for cleaning a substrate having a first side, comprising:
   a fluid for contacting the first side of the substrate; and
   a first sonic transducer and a second sonic transducer coupled to said fluid wherein said first transducer directs a first signal having a first frequency and a first phase to the first side, and wherein said second transducer directs a second signal having a second frequency and a second phase to the first side so as to provide an interference signal to the first side that is a superposition of said first signal and said second signal, wherein neither said first signal nor said second signal passes through the substrate before interfering, said interference signal for cleaning the first side of the substrate.

2. The apparatus as recited in claim 1, wherein there is a phase difference between said first signal and said second signal.

3. The apparatus as recited in claim 1, further comprising means for sweeping said interference signal across the substrate.

4. The apparatus as recited in claim 3, wherein said means for sweeping said interference signal comprises a circuit for varying a phase difference between said first signal and said second signal.

5. The apparatus as recited in claim 4, wherein said first and said second transducer each have an activation timing and said means for varying said phase difference between said first and second transducer comprises varying said activation timing.

6. The apparatus as recited in claim 3, wherein said first and said second transducer have a separation distance, and wherein said means for varying said phase difference between said first and second transducer comprises varying said separation distance.

7. The apparatus as recited in claim 3, wherein said means for sweeping said interference signal comprises moving the substrate.

8. The apparatus as recited in claim 3, wherein said means for sweeping said interference signal comprises moving said transducers.

9. The apparatus as recited in claim 1, wherein said first transducer has a first intensity and said second transducer has a second intensity wherein said interference signal has an intensity peak that is higher than either said first intensity or said second intensity.

10. The apparatus as recited in claim 1, wherein said first frequency is different from said second frequency.

11. The apparatus as recited in claim 10, wherein said interference signal has an oscillating frequency and a beat frequency wherein said oscillating frequency is higher than either said first frequency or said second frequency and said beat frequency is lower than either said first or said second frequency.

12. The apparatus as recited in claim 1, wherein the substrate is in a vessel and said vessel has a reflecting wall.

13. The apparatus as recited in claim 12, wherein said reflecting wall is oriented to reflect said signal back over the substrate.

14. The apparatus as recited in claim 12, wherein said reflecting wall is oriented to provide a reflected signal at an angle to said signal.

15. The apparatus as recited in claim 12, wherein said reflecting wall is pivotable.

16. The apparatus as recited in claim 12, wherein said reflecting wall is convex.

17. The apparatus as recited in claim 1, wherein the substrate is in a vessel and said vessel has damping to avoid reflection back on the substrate.

18. The apparatus as recited in claim 17, wherein said damping is provided by a damping surface.

19. The apparatus as recited in claim 18, wherein said damping surface comprises anecohic structures.

20. The apparatus as recited in claim 17, wherein said damping is provided by gas bubbles.

21. The apparatus as recited in claim 20, wherein said gas bubbles are provided from an external gas supply.

22. The apparatus as recited in claim 1, wherein the apparatus is for cleaning two sides of the substrate.

23. The apparatus as recited in claim 1, wherein said sonic transducers emit sound having a frequency from 20 kHz to 5 MHz.

24. The apparatus as recited in claim 1, wherein the substrate comprises a semiconductor wafer.

25. The apparatus as recited in claim 1, further comprising a third transducer.

26. The apparatus as recited in claim 25, wherein said third transducer is in line with said first and second transducers.

27. The apparatus as recited in claim 25, wherein said third transducer is located off said line between said first and second transducers.

28. The apparatus as recited in claim 25, wherein said transducers are arranged in an array of three or more.

29. The apparatus as recited in claim 28, wherein said array is planar.

30. The apparatus as recited in claim 28, wherein said array has a shape conforming to the substrate.

31. The apparatus as recited in claim 1, wherein said fluid is directed on the substrate as a stream and wherein said first and said second transducers couple to said stream.

32. The apparatus as recited in claim 31, wherein said stream is scanned across the substrate.

33. The apparatus as recited in claim 32, wherein said interference signal has an intensity and wherein said intensity is varied as said stream scans across the substrate.

34. The apparatus as recited in claim 31, wherein said stream is directed perpendicular to the substrate.

35. The apparatus as recited in claim 31, wherein said stream is directed along said first side.

36. The apparatus as recited in claim 35, wherein said stream is directed along two sides of said substrate.

37. The apparatus as recited in claim 31, wherein the substrate spins.

38. The apparatus as recited in claim 1, wherein said fluid is a puddle on the substrate and wherein said first and said second transducers couple to said puddle.

39. The apparatus as recited in claim 38, wherein the substrate spins.

40. An apparatus for cleaning a substrate, comprising:
a fluid for contacting the substrate;
a first sonic transducer and a sonic second transducer coupled to said fluid wherein said first transducer produces a first signal having a first phase and said second transducer produces a second signal having a second phase, there being a phase difference there between, wherein said first and second signals overlap to provide an interference signal that is a superposition of said first signal and said second signal; and
means for sweeping said interference signal across the substrate to clean the substrate.

41. The apparatus as recited in claim 40, wherein the substrate spins.

42. The apparatus as recited in claim 40, wherein said interference signal couples to one side of the substrate.

43. The apparatus as recited in claim 40, wherein said interference signal couples to two sides of the substrate.

44. The apparatus as recited in claim 40, wherein said interference signal couples to a fluid stream directed on the substrate.

45. The apparatus as recited in claim 40, wherein said interference signal couples to a puddle of fluid on the substrate.

46. The apparatus as recited in claim 40, wherein said interference signal comprises beats.

47. A method for cleaning a substrate having a first side, comprising the steps of:

(a) providing a fluid in contact with the substrate; and (b) providing a first sonic transducer and a second sonic transducer coupled to said fluid wherein said first transducer directs a first signal having a first frequency and a first phase to the first side, and wherein said second transducer directs a second signal having a second frequency and a second phase to the first side, so as to provide an interference signal to the first side that is a superposition of said first signal and said second signal, wherein neither said first signal nor said second signal passes through the substrate before interfering, said interference signal for cleaning the substrate.

48. A method for cleaning a substrate, comprising the steps of:

(a) providing a fluid in contact with the substrate;

(b) providing a first sonic transducer and a second sonic transducer coupled to said fluid wherein said first transducer produces a first signal having a first phase and said second transducer produces a second signal having a second phase, there being a phase difference there between, there being an interference signal that is a superposition of said first signal and said second signal; and (c) providing means for sweeping said interference signal across the substrate to clean the substrate.

* * * * *